United States Patent

Maeda et al.

[11] 4,057,458
[45] Nov. 8, 1977

[54] METHOD OF MAKING NICKEL ZINC FERRITE BY LIQUID-PHASE EPITAXIAL GROWTH

[75] Inventors: Kunihiro Maeda; Hiromichi Imahasi, both of Hitachi; Matsunosuke Kikuchi, Mito, all of Japan

[73] Assignee: Hitachi, Ltd., Japan

[21] Appl. No.: 613,502

[22] Filed: Sept. 15, 1975

[30] Foreign Application Priority Data

Sept. 17, 1974 Japan ................................. 49-106079

[51] Int. Cl.² .......................... B01J 17/04; B01J 17/34
[52] U.S. Cl. .................................. 156/603; 156/624; 156/DIG. 74; 156/DIG. 77; 23/305 F; 252/62.62; 423/594
[58] Field of Search ............... 156/624, 610, 603, 600, 156/DIG. 74, DIG. 77; 23/305 F; 252/62.62; 423/594

[56] References Cited

U.S. PATENT DOCUMENTS

| | | | |
|---|---|---|---|
| 2,848,310 | 8/1958 | Remeika | 23/305 FX |
| 3,115,469 | 12/1963 | Hamilton | 252/62.62 X |
| 3,332,796 | 7/1967 | Kooy | 23/305 FX |
| 3,498,836 | 3/1970 | Gambino | 156/62.4 |
| 3,736,106 | 5/1973 | Hamelin et al. | 156/62.4 |
| 3,846,322 | 11/1974 | Sugimoto et al. | 23/305 F |

*Primary Examiner*—Norman Yudkoff
*Assistant Examiner*—Barry I. Hollander
*Attorney, Agent, or Firm*—Craig & Antonelli

[57] ABSTRACT

A method of making nickel zinc ferrite by liquid-phase epitaxial growth at constant temperature ferrite thin films having desired magnetic properties can easily be formed by preparing the metal oxide melt components from which the ferrite thin films are epitaxially crystallized. The ferrite thin films are suitable for various electronic parts.

4 Claims, 8 Drawing Figures

METHOD OF MAKING NICKEL ZINC FERRITE BY LIQUID-PHASE EPITAXIAL GROWTH

BACKGROUND OF THE INVENTION

Most of the ferrite materials used in a variety of those electronic devices and precision instruments which utilize magnetic properties have been manganese zinc ferrite and nickel zinc ferrite.

Although available in the form of a large single crystal with relative easiness, manganese zinc ferrite is poor in corrosion resistance and when, for example, subjected to a chemical etching process using a photomask, abnormally etched holes tend to occur locally so that various difficulties are encountered in its actual use.

A large single crystal of nickel zinc ferrite, on the other hand, though much superior in corrosion resistance, is difficult to produce and there has been no established process for the commercial production of high-quality nickel zinc ferrite single crystals. It has been produced, heretofore, for the most part by sintering or hot-pressing of powdered materials. The resulting product, however, often contains many internal defects such as void and has suffered from detached crystal grains during cutting and polishing or processing so that a uniform magnetic substance with smooth surface has hardly been obtained. Electrolytic plating can produce a ferrite film which, however, is not necessarily of desired quality, because of well-known difficulties in controlling composition of a ternary plating system.

There is also a process in actual use, which produces ferrite film by chemical vapor deposition (CVD) on a single crystal substrate. This process includes a difficult regulation of composition of the growing ferrite film. When nickel zinc ferrite film is grown, the reaction system comprises three vaporizing parts of reactants and a growing part, all of which require precise temperature control in addition to flow rate regulation of at least one carrier gas. Moreover, growth rate of the ferrite film is low in CVD process, requiring several hours to obtain a film of 20 μm thickness and resulting in operational inefficiency which makes it difficult to supply a large quantity of the ferrite film.

U.S. Pat. No. 2,848,310 discloses a method of making nickel zinc ferrite, which comprises dissolving the ferrite constituents in a lead oxide melt at high temperatures, introducing seed crystals, and growing a single crystal ferrite on the seed crystals by gradually reducing the temperature of melt to deposit the ferrite. It is impossible, therefore, to form a ferrite of special composition or of a large size or to grow continuously ferrite single crystals.

Japanese Patent Application Laid-Open No. 10,975/72 [U.S. Pat. application Ser. No. 89,632 (Nov. 16, 1972] discloses a liquid phase epitaxial growth method for garnet as a means to form a large size of single crystal film. One of the important problems in the liquid-phase epitaxial growth method is the choice of a substrate conforming to the conditions of deposition and to the properties of the deposit. Another problem is to select the melt composition to maintain stable conditions for deposition. These selections vary in a wide range depending on the intended product to be epitaxially grown and must be properly done in each individual case.

SUMMARY OF THE INVENTION

The first object of this invention is to provide a process for forming nickel zinc ferrite by liquid-phase epitaxial growth at constant temperatures.

The second object of this invention is to provide a process for forming nickel zinc ferrite film having any desired composition on a magnesium oxide substrate with a good reproducibility.

The third object of this invention is to provide a process for forming nickel zinc ferrite film having improved magnetic properties.

As a result of investigations conducted in search of a novel method for making nickel zinc ferrite single crystals, the present inventors have found that an intended ferrite film may be obtained by the liquid-phase epitaxial growth method.

According to this invention, a ferrite single crystal is grown epitaxially on a substrate immersed in a melt comprising a molten metal oxide at a high temperature, in which the constituent components of nickel zinc ferrite have been dissolved and maintained in a supercooled state, that is, in a supercooled and stable state, it is necessary to keep composition of the melt within a proper range. Since the rate of epitaxial growth and the physical properties of the resulting ferrite film depend on the composition of melt and other conditions, it is necessary to select the conditions of epitaxial growth from a collective viewpoint.

DETAILED DESCRIPTION OF THE PREFERRED EMBODIMENT

Nickel zinc ferrite has a spinel crystal structure and generally represented by the formula $Ni_xZn_{1-x}Fe_2O_3$ or $(NiO)_x(ZnO)_{1-x}Fe_2O_3$, the molar ratio of $(NiO + ZnO)$ to $Fe_2O_3$ being 1. There are several ferrites differing from one another in the ratio of NiO to ZnO, which affects physical properties of the ferrite.

The metal oxide suitable for a flux melt which dissolves constituent components of the crystal to be grown epitaxially and allows the crystal to grow at a temperature for lower than its melting point is selected from those having a low melting point, a high dissolving power for the components of ferrite crystals and suitable handling characteristics. Suitable metal oxides for the flux from which nickel zinc ferrite is grown are lead oxide, bismuth oxide, and barium oxide. Of these, lead oxide was found to be the most suitable for growing nickel zinc ferrite crystals, as a result of experiments on viscosity and suitable temperature range for growing crystals and on impurities in the grown crystals.

Basic requirements for the substrate crystal on which a high-quality epitaxially grown film is obtained are that its crystal structure, lattice constant, and thermal expansion coefficient approximate as closely as possible to those of the ferrite film to be grown thereon. The substrate crystal, moreover, should not be reactive to or corroded by the melt or the deposit, the crystals of magnesium oxide (MgO), spinel ($MgAl_2O_4$), and sapphire ($Al_2O_3$) are suitable for the substrate conforming to the above requirements in the epitaxial growing of nickel zinc ferrite films. Magnesium oxide, however, undergoes marked corrosion in a lead oxide melt at a temperature above 820° C., resulting in non-uniform surface of the substrate. A desirable result, however, is obtained by precoating the surface with a thin layer of nickel zinc ferrite by CVD technique or by forming a thin ferrite layer on the surface at a temperature below 800° C. at which no corrosion will take place and then forming another layer under a predetermined higher temperature condition. Magnesium oxide is particularly preferred as the substrate for nickel zinc ferrite crystal, because its lattice constant, when multiplied by 2, approximates to that of nickel zinc ferrite crystal and both crystals belong to the same cubic system, though different in crystal structure. Manganese zinc ferrite is also preferable for the substrate. Although it is corroded in the melt at high temperatures, it is made usable as the substrate by protecting its surface with a thin undercoat of nickel zinc ferrite formed by CVD techniques; a succeeding ferrite layer may be formed by the liquid-phase epitaxial growth.

Figure 1:
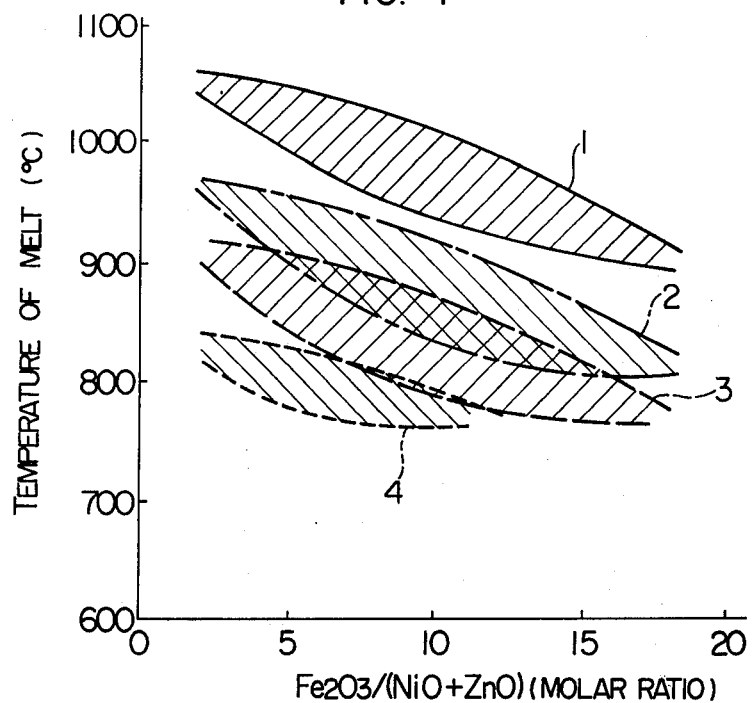
FIG. 1 is diagrams showing relationships between the temperature range of supercooling and the molar ratio of $Fe_2O_3/(NiO + ZnO)$.

The liquid-phase epitaxial growth on the substrate can be performed by two different procedures with respect to temperature control; one being a descending temperature procedure in which the crystal growing is carried out while the temperature is slowly desceding and the other a constant temperature procedure in which the temperature is kept constant. The descending temperature procedure tends to yield a ferrite crystal which is not uniform both in its composition and structure and is unsuitable for commercial large-scale production. In the constant temperature procedure, it is necessary to keep the melt in a stable supercooled state for a long period of time by properly selecting the melt composition. To maintain such a stable supercooled state, the constant temperature procedure is advantageously in commercial operation. The melt composition should be selected so that the degree of supercooling may exceed 20° C. and supercooling may be maintained for about 48 hours. The iron oxide content and the boron oxide content of the present melt affect very much the degree of supercooling. FIG. 1 shows the relationship between the iron oxide ratio and the temperature range for epitaxial growth. In FIG. 1, the hatched area shows the zone of supercooled state or the epitaxial growth temperature zone. The ($Fe_2O_3$ + NiO + ZnO) content is 9% by weight in the zone 1, 7% by weight in the zones 2 and 3, 5% by weight in the zone 4. The NiO/ZnO ratio is 1/1 in the zones 1 and 2, and is 2/8 in the zone 3. The melt contains 3% by weight of boron oxide, the remainder being lead oxide. With the increase in total solute content, the rate of growth of the ferrite increases. The solute content, however, cannot be increased to so high a value, because the melt temperature also increases. Since the required degree of supercooling is at least 20° C. as mentioned above, the molar ratio of $Fe_2O_3$ to (NiO + ZnO) should be 2 or larger. Although the maximum degree of supercooling is attained at the said ratio of about 10, a smaller molar ratio is preferred in view of magnetic properties and growth rate of the ferrite film. Accordingly, a suitable molar ratio under practical conditions is in the range from 2.5 to 10. When the total concentration of ($Fe_2O_3$ + NiO + ZnO) is increased, the epitaxial growth temperature zone shifts toward the high temperature side and, in addition, corrosion resistance of the crucible begins to present a difficult problem. Therefore, from the collective viewpoint, a suitable total solute concentration is in the range from 6 to 10%, preferably from 8 to 10%, by weight.

Figure 2:
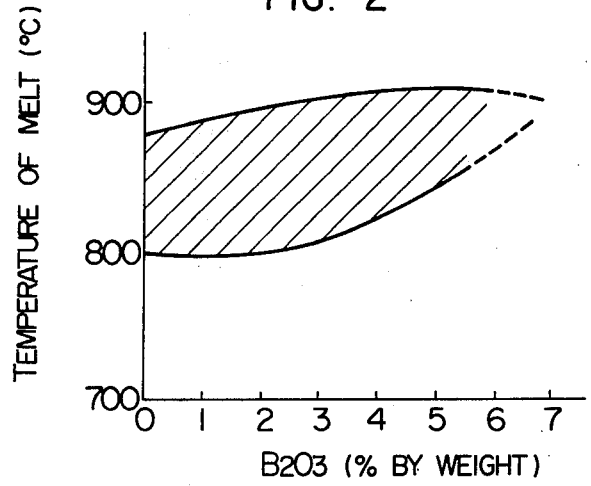
FIG. 2 is a diagram showing relationship between the temperature range of supercooling and the boron oxide content.

The amount of boron oxide added also affects the epitaxial growth temperature as shown in FIG. 2, where the results of experiments conducted on the melt containing 7% by weight of the total solute were plotted. The addition of boron oxide to lead oxide causes a decrease in viscosity of the melt and an increase in growth rate of the ferrite film and, in addition, causes reduction in coersive force of the resulting ferrite film, thus improving switching characteristics. It is not advantageous, however, to add more than 6% by weight of boron oxide, because a reduction in the supercooling temperature zone will be resulted. Since the growth rate of ferrite film begins to increase markedly when the added amount of boron oxide reaches about 1.5% by weight, a suitable amount of boron oxide is in the range from 1.5 to 6% by weight, preferably from 2.5 to 6% by weight in view of magnetic properties of the resulting ferrite film, as will be shown later. In this invention, in place of the boron oxide, lead fluoride may be used to attain the same effect.

According to this invention, the molar ratio of (NiO + ZnO) to $Fe_2O_3$ in the resulting nickel zinc ferrite is nearly stoichiometric, i.e. 1 : 1, irrespective of said ratio in the melt. Since the ratio of Zn to (Ni + Zn) in nickel zinc ferrite affects magnetic properties of the latter, it is necessary to regulate said ratio in order to obtain a ferrite having intended magnetic properties.

Figure 3:
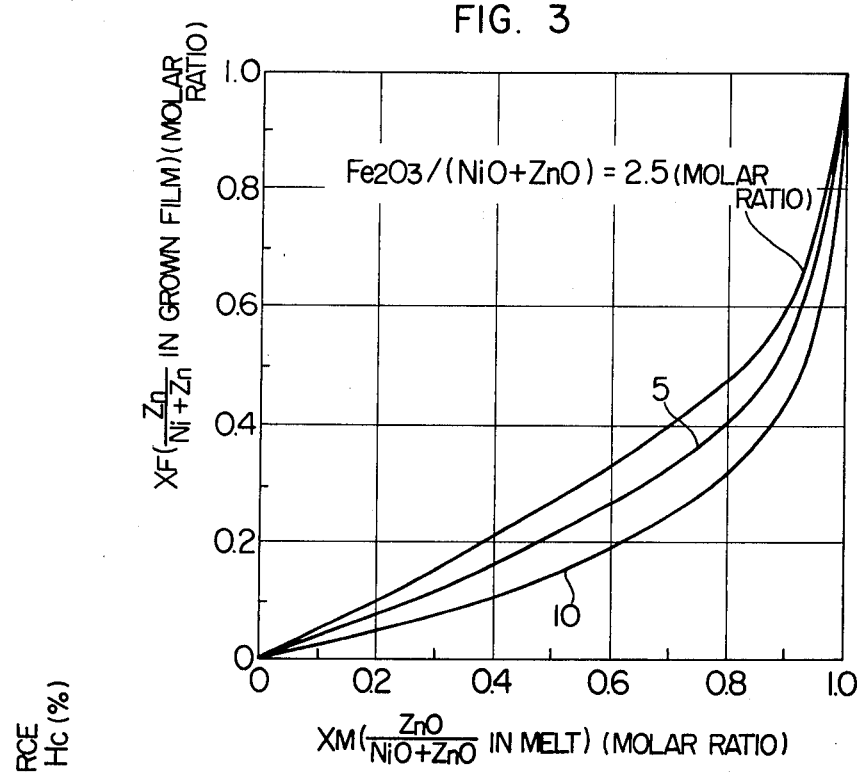
FIG. 3 is diagrams showing relationships between the ratio Ni/Zn in the resulting ferrite and that in the melt.

The ratio of Zn to (Ni + Zn) in the ferrite film (hereinafter this ratio is referred to as $X_F$) obtained by the liquid-phase epitaxial growth method depends upon the ratio of ZnO to (NiO + ZnO) in the melt (hereinafter this ratio is referred to as $X_M$) and the ratio of $Fe_2O_3$ to (NiO + ZnO) in the melt, as shown in FIG. 3. As is seen from FIG. 3, irrespective of the ratio of $Fe_2O_3$ to (NiO + ZnO), with the change in the ratio $X_M$, the ratio $X_F$ changes rapidly in the range where $X_M$ is relatively large, while $X_F$ changes slowly in the range where $X_M$ is relatively small. Accordingly, in order to grow a ferrite film having $X_F$ of 0.5 or larger, a strict control of the concentrations of zinc oxide and nickel oxide becomes necessary. Since such a strict control is very difficult in a large-scale commercial production, it is necessary to use another technique given below which allows the production of a ferrite film having a high $X_F$ from a melt of low $X_M$.

A melt having $X_M$ of 0.8 or smaller and another melt containing no nickel and for use in growing zinc ferrite are prepared. A substrate is immersed alternately in these two melts to form thereon a laminate of a nickel zinc ferrite film containing a low proportion of nickel and a zinc ferrite film. The resulting laminate is then subjected to a thermal diffusion treatment at a temperature at which the laminate is transformed into a ferrite film of uniform and predetermined composition. The same result is obtained, if necessary, by interposing a nickel ferrite layer containing no zinc.

Figure 4:
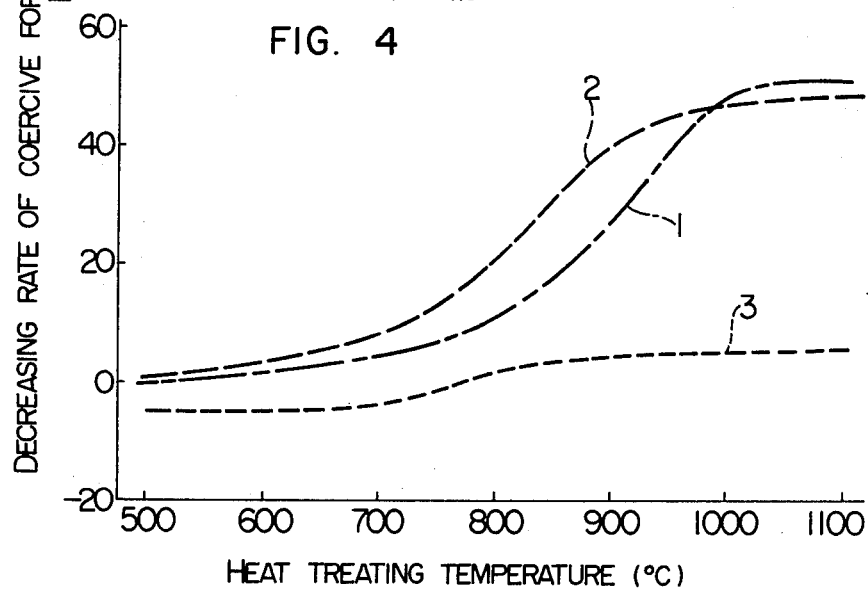
FIGS. 4 and 5 are diagrams showing magnetic properties of the epitaxially grown films after having been heat-treated at various temperatures.
Figure 5:
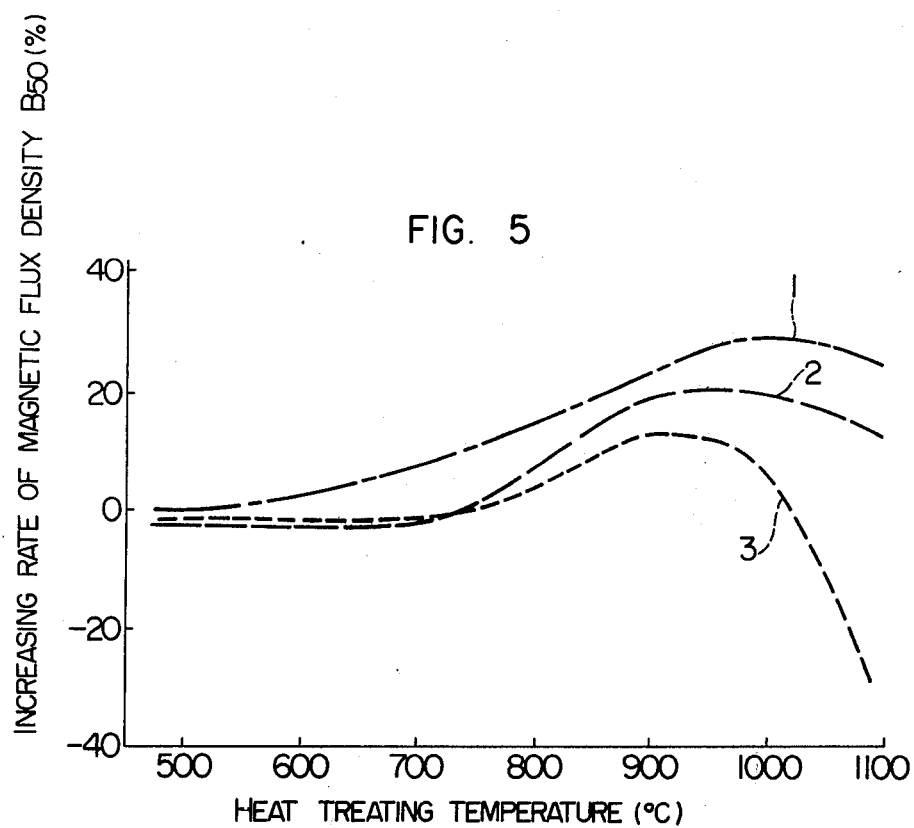

The single-crystal ferrite and polycrystal ferrite obtained by the present liquid-phase epitaxial growth method can be utilized as a ferrite material either as such or after having been improved by heat-treatment in physical properties such as coersive force and magnetic flux density. For example, ferrite film was grown on a magnesium oxide substrate from a melt containing 7% by weight of total solute (NiO + ZnO + $Fe_2O_3$), the molar ratio $Fe_2O_3$/(NiO + ZnO) being 10, and 3% by weight of boron oxide in the melt, and the resulting ferrite film was heat-treated for 2 hours in the air, under an oxygen stream, or under a nitrogen stream. The results of tests for coersive force and magnetic flux density before and after heat treatment at various temperatures were as shown in FIGS. 4 and 5, wherein the curves 1, 2, and 3 correspond to the heat treatment in the air, under an oxygen stream, and under a nitrogen stream, respectively. When the ferrite film was heat-treated in the air, the coercive force begun to decrease at 800° C. and reached a value one-half the initial value, whereas when heat-treated under a nitrogen atmosphere, substantially no change was observed in the coercive force. The magnetic flux density showed a maximum value when heat-treated at 900° to 1,000° C., irrespective of the type of atmosphere, and decreased when heat-treated at higher temperatures. Therefore, when a soft magnetic material is required, it is preferable to heat-treat the ferrite film at 900° to 1,050° C under an atmosphere containing oxygen.

In the following Examples, the magnetic properties were determined after heat-treatment.

EXAMPLE 1

A thoroughly blended mixture of predetermined quantities of powdered oxides used as raw materials was introduced in a platinum crucible and kept in a vertical furnace heated at 1,100° C. for about 2 hours, while being gently stirred to homogenize the melt. Thereafter, the crucible was cooled and kept at a predetermined temperature. A magnesium oxide single-crystal substrate, about 1 mm in thickness and smoothly polished along its (100) plane, was held with a platinum fixture and hung above the melt surface until its temperature became the same as that of the melt. In a run where a high melt temperature was used, the substrate surface had been precoated with a nickel zinc ferrite layer, 500 to 1,000 Å thick, grown by CVD method.

When its temperature became the same as that of melt, the substrate was immersed in the melt while being rotated at 100 rpm, withdrawn from the melt after a predetermined period of time, removed of the adhere melt, and tested for the thickness and properties of the grown film to obtain the results as shown in Table 1. The melt contained 5% by weight of boron oxide in addition to the solutes, the remainder being lead oxide.

Judging from the growth rate and the coercive force, most preferred results were obtained when the concentration of solutes were 8 to 10% by weight, the ratio $Fe_2O_3$/(NiO + ZnO) being 5 to 10, and the degree of supercooling was 20° C. or greater.

It was confirmed from the results of X-ray diffraction and chemical analysis that $Ni_xZn_{1-x}Fe_2O_4$ was a ferrite crystal of the spinel type.

Table 1

| Run No. | Solute concentration (% by weight) | $\frac{Fe_2O_3}{(NiO + ZnO)}$ | Temperature of growth (° C) | Degree of supercooling (° C.) | Growth rate (μm/min.) | Coercive force (Oe) | Over-all rating |
|---|---|---|---|---|---|---|---|
| 1 | 4 | 1.5 | — | — | — | — | X |
| 2 | " | 5 | 795 | 5 | 0.08 | 23 | Δ |
| 3 | " | 10 | 780 | 10 | 0.05 | 28 | Δ |
| 4 | 4 | 20 | — | — | — | — | X |
| 5 | 6 | 1.5 | — | — | — | — | X |
| 6 | " | 2 | 853 | 5 | 0.1 | 11.2 | Δ |
| 7 | " | 3 | 848 | 15 | 0.25 | 7.1 | O |
| 8 | " | 5 | 846 | 20 | 0.3 | 6.3 | O |
| 9 | " | 10 | 825 | 30 | 0.35 | 4.1 | O |
| 10 | " | 15 | 794 | 10 | 0.22 | 7.7 | O |
| 11 | " | 20 | 787 | 5 | 0.08 | 14.2 | Δ |
| 12 | 6 | 25 | — | — | — | — | X |
| 13 | 8 | 1.5 | — | — | — | — | X |
| 14 | " | 2.5 | 994 | 10 | 0.4 | 3.2 | O |
| 15 | " | 5 | 932 | 20 | 1.5 | 2.8 | ◎ |
| 16 | " | 10 | 898 | 30 | 3.5 | 2.1 | ◎ |
| 17 | " | 15 | 880 | 20 | 0.8 | 3.5 | O |
| 18 | " | 20 | 861 | 15 | 0.4 | 4.4 | O |
| 19 | 8 | 25 | — | — | — | — | X |
| 20 | 10 | 1.5 | — | — | — | — | X |
| 21 | " | 2.5 | 1093 | 10 | 1.4 | 2.3 | O |
| 22 | " | 5 | 1036 | 30 | 3.8 | 1.8 | ◎ |
| 23 | " | 10 | 1004 | 30 | 2.9 | 2.0 | ◎ |
| 24 | " | 15 | 970 | 20 | 1.6 | 2.4 | O |
| 25 | " | 20 | 952 | 10 | 0.3 | 3.1 | O |
| 26 | 10 | 25 | — | — | — | — | X |

Note:
The marks employed in the above Table 1 have the following meanings.
"◎" Very good
"O" Good
"Δ" Fairly good
"X" Bad

EXAMPLE 2

A grown ferrite layer was obtained by immersing a magnesium oxide substrate for 10 minutes in a melt containing 8% by weight of solutes and 0, 2, 4, 6, or 8% by weight of lead fluoride, the remainder being lead oxide.

The amount of growth and the coercive force of the ferrite film relative to the concentration of lead fluoride were found to be as shown in Table 2.

Table 2

| Run No. | Lead fluoride (% by weight) | Film thickness (μm) | Coercive force (Oe) |
|---|---|---|---|
| 27 | 0 | 9 | 30 |
| 28 | 2 | 14 | 18 |
| 29 | 4 | 17 | 3.2 |
| 30 | 6 | 18 | 3.5 |
| 31 | 8 | — | — |

When the amount of lead fluoride was 8% by weight, red-brown ferrite film was formed only on a part of the substrate and no uniform film was obtained.

EXAMPLE 3

The (100) plane or (111) plane of single crystal magnesium oxide was smoothly polished and used as substrate. Epitaxial growth of the ferrite film was carried out under the conditions of Run No. 10 of Example 1 for 5 minutes and then under the conditions of Run No. 22 of Example 1 for further 10 minutes. The melt temperature was as low as 794° C. in the former growth step and as high as 1,036° C. in the latter growth step. For comparison, a magnesium substrate was treated only under the conditions of Run No. 22 (the former growth step was omitted).

On microscopic examination of polished cross-section of the resulting specimen, it was found that the specimen obtained by the above-said two-step treatment retained its original surface and the surface irregularities of the ferrite film grown on (100) plane were less than several μm in depth, while the ferrite film grown on (111) plane showed a specular surface, the same as that of the substrate; whereas the comparative specimen treated only under the conditions of Run No. 22 showed corroded substrate surface, its surface irregularities being about 50 μm in depth and, accordingly, the grown ferrite film showed a rough surface, the film thickness being only tenth of the thickness of film grown in two steps.

EXAMPLE 4

In a platinum crucible, a powder mixture of the composition (a) in Table 3 was heated at 1,100° C. for 2 hours to prepare a homogeneous melt. The resulting melt was cooled and kept at 800° C. A substrate crystal maintained at a temperature the same as or several degress higher than the melt temperature was held with a platinum fixture and immersed in the melt and rotated at 62.5 rpm. The substrate crystal used had been prepared by cleaving a magnesium oxide single crystal to a thickness of about 1 mm. All treatments were performed under the atmosphere. After having been rotated in the melt for 9.5 minutes, the substrate was taken out of the melt. It was found that the substrate was covered all over the surface with zinc ferrite film, 30 μm in thickness, which had been grown epitaxially on the plane (100) of the substrate. Then, a melt of the composition (b) in Table 3 was homogenized in the same manner as mentioned above and kept at 950° C. The above-noted substrate bearing the zinc ferrite film was immersed in the melt at 950° C. for 12.25 minutes while being rotated at 62.5 rpm, and then taken out of the melt. After the above-said two steps of treatment, it was found that a nickel ferrite film, 13 μm in thickness, had been epitaxially grown on a zinc ferrite film, 30 μm in thickness. This double-layered epitaxial ferrite film was subjected to a thermal diffusion treatment in the air at 1,100° C. for 5 hours. X-ray diffraction test revealed that before the thermal diffusion treatment, diffraction peaks of magnesium oxide substrate (lattice constant $a$ = 4.213 A), nickel ferrite ($a$ = 8.34 A), and zinc ferrite ($a$ = 8.44 A) were observed, whereas after the thermal diffusion treatment, beside the diffraction peaks of the magnesium oxide substrate, only the diffraction peaks of nickel zinc ferrite ($a$ = 8.411 A) were observed, indicating that a single-phase film of nickel zinc ferrite had been formed on the magnesium oxide substrate. Chemical analysis showed that $X_F$ = 0.694 – 0.703 ($Ni_{0.306} Zn_{0.694} Fe_2O_4 - Ni_{0.298} Zn_{0.802} Fe_2O_4$), which was very close to the ratio of zinc ferrite film thickness to total thickness of nickel ferrite film and zinc ferrite film before thermal diffusion treatment; $X_T$ – 30/(30 + 13) = 0.698. The lattice constant found by analysis coincided well with the theoretical value.

Table 3

| Composition | Type of melt | | |
|---|---|---|---|
| | (a) | (b) | (c) |
| NiO | 0 (g) | 0.939 | 0.949 |
| ZnO | 1.018 | 0 | 0.917 |
| $Fe_2O_3$ | 19.982 | 20.061 | 19.135 |
| PbO | 270.0 | 270.0 | 270.0 |
| $B_2O_3$ | 8.0 | 9.0 | 9.0 |
| $X_M$ = ZnO/(NiO + ZnO) | 1 (molar ratio) | 0 | 0.47 |
| $Fe_2O_3$/(NiO + ZnO) | 10 (molar ratio) | 10 | 5 |

EXAMPLE 5

In the same manner as in Example 4, by use of a melt of the composition (a) in Table 3 a zinc ferrite film, 30 μm in thickness, was grown on a cloven magnesium oxide substrate plate. Thereafter, using a melt of the composition (c) ($X_M$ = 0.47) in Table 3, a nickel zinc ferrite film ($Ni_{0.8} Zn_{0.2} Fe_2O_4$; $X_F$ = 0.2), 10 μm in thickness, was grown on said zinc ferrite film, at a growth temperature of 890° C. during a growth period 4.5 minutes, and heat-treated under the same conditions as in Example 4 to obtain a ferrite film ($Ni_{0.2} Zn_{0.8} Fe_2O_4$; $X_F$ = 0.8).

EXAMPLE 6

Each of the zinc ferrite film and the nickel ferrite film in Example 4 was formed in two steps so that final laminate may be composed of four alternate layers of zinc ferrite and nickel ferrite, each layer having one-half of the thickness of the ferrite film in Example 4 and the total thickness of each type of ferrite being the same as the thickness of each type of ferrite in Example 4 (30 μm for zinc ferrite and 13 μm for nickel ferrite). A nickel zinc ferrite film equivalent to that in Example 4 was obtained after heat-treatment at the same temperature as in Example 4 for 2 hours.

EXAMPLE 7

Figure 6:
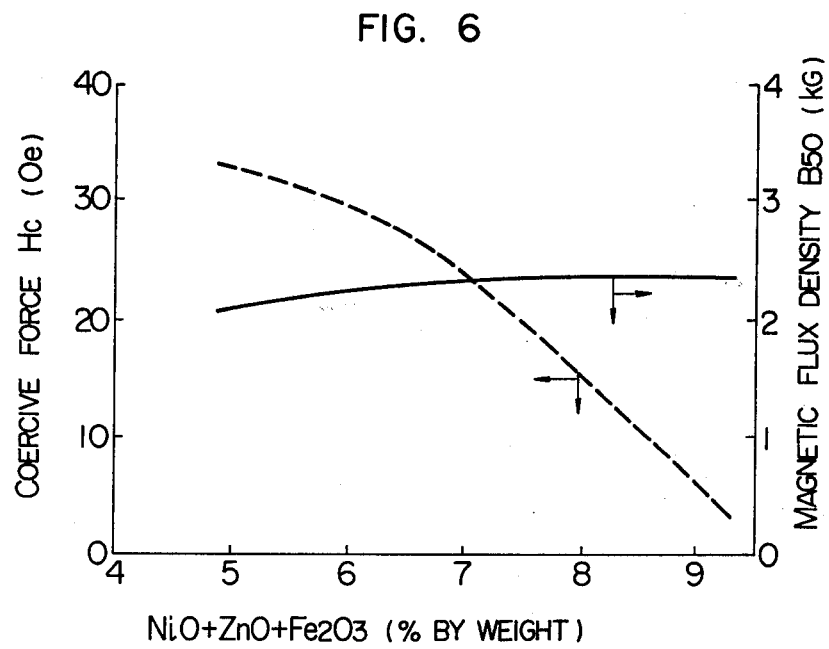
FIG. 6 is a diagram showing magnetic properties of the film in relation with amount of solutes.

Following the same two-step epitaxial growth procedure in Example 3, a nickel zinc ferrite film was formed on a substrate which had been cut out of a manganese zinc ferrite single crystal and had its surface polished. The substrate was immersed for 5 minutes in a melt of the composition (a) in Table 4 to form a smooth and flat nickel zinc ferrite film, 1.2 μm in thickness. The substrate thus treated was then immersed in a bath of the composition (b) in Table 4 for 15 minutes to form another ferrite film, 30 to 34 μm in thickness, on the said nickel zinc ferrite film. Incision was made into the resulting single crystal from the back side to reach the substrate, and the substrate plate was dissolved away by immersing it in hot dilute nitric acid, leaving behind a nickel zinc ferrite film. The film was heat-treated in the air at 950° C. for 1 hour. Magnetic properties of the film were tested both before and after the heat treatment and the results obtained were as shown in FIG. 6.

When the nickel zinc ferrite film was formed on the substrate directly from the melt (b) without using the melt (a), the substrate plate was severely corroded and the test results for magnetic properties fluctuated too much to be shown herein.

Table 4

| Item | Composition of bath and conditions for growing | |
|---|---|---|
| | Melt | |
| | a | b |
| $Fe_2O_3/(NiO + ZnO)$ | 10/1 | 5/1 |
| NiO/ZnO | 3/7 | 1/9 |
| $B_2O_3$ (weight-%) | 1.8 | 3 |
| $NiO + ZnO + Fe_2O_3$ (weight-%) | 7 | 5-9 |
| PbO (weight-%) | 91.2 | 92-88 |
| Temperature (° C.) | 795 | 880 |

EXAMPLE 8

A method of making a magnetic recording head by applying the present invention is explained below.

Figure 7A:
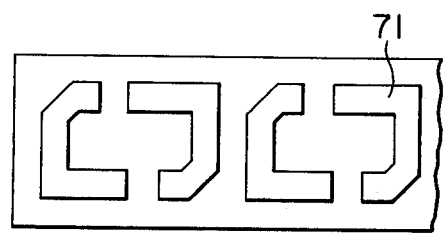
FIG. 7 shows production of magnetic head from the film.

A piece, 20 mm × 20 mm and 0.5 mm thick, cut out of magnesium oxide single crystal was lapped by use of lapping plate made of tin and diamond abrasive grains, 3 μm in particle diameter. Final polishing was done by use of a suspension of silica, 200 Å in particle diameter, and a synthetic leather to remove surface strain. Head yoke pattern 71 shown in FIG. 7a was formed on the polished surface by applying sputtered platinum coating, 800 Å in thickness, so as to expose the substrate surface in the form of said head yoke.

A powdered mixture comprising, by weight, 91.18% of PbO, 1.83% of $B_2O_3$, 0.08% of NiO, 0.24% of ZnO, and 6.67% of $Fe_2O_3$ was placed in a platinum crucible and kept in an electric furnace at 1,000° C. for 2 hours to obtain a homogeneous melt. THe melt was then cooled to 810° C. at a precisely programmed rate of 100° C./hour.

Figure 7B:
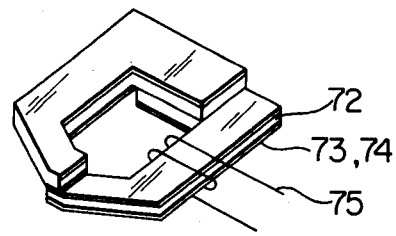

The magnesium oxide substrate held with a platinum fixture was kept hung just above the crucible for several minutes and then immersed, while being rotated, quietly into the melt. In 60 minutes, nickel zinc ferrite film, about 30 μm in thickness, was grown epitaxially on the substrate surface, except for the portion covered with sputtered platinum film. The resulting piece was treated with hot, dilute nitric acid to obtain patterned nickel zinc ferrite layers. The patterned layers 72 were applied with sputtered coatings of silicon monoxide 73, 0.4 μm in thickness and soda lime glass 74, 0.1 μm in thickness, except for the rear portion used for magnetic circuit connection. The coated pieces were placed one over another, as shown in FIG. 7b, and press-bonded at 750° C. The finished magnetic head with a winding 75 had a track width of 20 μm and a gap 1 μm and was much smaller in size than a conventional wound-type head. A magnetic recording and reproducing device utilizing the present head was markedly improved in recording density.

What is claimed is:

1. A method for forming nickel zinc ferrite, which comprises immersing a crystal substrate in a supercooled melt comprising lead oxide, iron oxide, 6% by weight or less of boron oxide or lead fluoride, and such amounts of nickel oxide and zinc oxide that the molar ratio ZnO/(NiO + ZnO) is 0.8 or smaller and then in a supercooled melt comprising lead oxide, iron oxide, zinc oxide, and 6% by weight or less of boron oxide or lead fluoride to form by epitaxial growth at least two layers of nickel zinc ferrite and zinc ferrite on said substrate, and then converting the resulting layers into a homogeneous single layer of nickel zinc ferrite by thermal diffusion treatment.

2. A method for forming nickel zinc ferrite according to claim 1, wherein the crystal substrate comprises a member selected from the group consisting of magnesium oxide, spinel, sapphire, and manganese zinc ferrite.

3. A method for forming nickel zinc ferrite according to claim 2, wherein the crystal substrate is magnesium oxide or magnesium zinc ferrite coated with a thin film of nickel zinc ferrite formed by a chemical vapor deposition method.

4. A method for forming nickel zinc ferrite according to claim 1, wherein the crystal substrate is a polished plane along the (111) crystallographic plane.

* * * * *